United States Patent [19]
Igarashi

[11] Patent Number: 4,504,796
[45] Date of Patent: Mar. 12, 1985

[54] MICROWAVE CIRCUIT APPARATUS
[75] Inventor: Sadao Igarashi, Soma, Japan
[73] Assignee: Alps Electric Co., Ltd., Tokyo, Japan
[21] Appl. No.: 431,126
[22] Filed: Sep. 30, 1982
[30] Foreign Application Priority Data
  Nov. 26, 1981 [JP] Japan .................................. 56-189573
[51] Int. Cl.³ .......................... H03F 3/60; H03F 3/193
[52] U.S. Cl. .................................... 330/286; 330/277; 330/296
[58] Field of Search ................ 330/53, 286, 277, 296, 330/307

[56] References Cited
U.S. PATENT DOCUMENTS
  3,940,706  2/1976  Stegens ............................ 330/53 X OTHER PUBLICATIONS
Goel et al., "A 4–8 GHz Dual Gate M.E.S.F.E.T. Amplifier", Electronics Letters, vol. 14, No. 6, Mar. 16, 1978, pp. 167, 168.

Primary Examiner—James B. Mullins
Attorney, Agent, or Firm—Guy W. Shoup; Gerard F. Dunne

[57] ABSTRACT

A microwave circuit apparatus is disclosed which includes at least one first microstrip line; at least one second microstrip line; at least one capacitor interposed between the first and second microstrip lines; and a functional element having a first electrode thereof connected high frequency-wise to the first microstrip line, and in which the second microstrip line is grounded with respect to a power source.

3 Claims, 10 Drawing Figures

MICROWAVE CIRCUIT APPARATUS

BACKGROUND OF THE INVENTION

This invention relates to a microwave circuit apparatus. More particularly, the present invention relates to a microwave circuit apparatus suitable for a self-bias circuit of a functional element.

As is known generally, bias circuits are classified as a self-bias circuit or a fixed bias circuit, and these two types of circuits are suitably employed depending upon the intended application.

If a microwave circuit apparatus such as a microwave amplifier, for example, is constructed by the conventional self-bias circuit, the grounding effect of the electrode of a functional element to be grounded for high frequencies drops and the microwave apparatus fails to provide sufficient electric performance. On the other hand, if the microwave amplifier is constructed by the fixed bias circuit, the performance can be improved but positive and negative power sources must be used so that the apparatus becomes more complicated in construction and more expensive to produce. Accordingly, a microwave circuit apparatus that can provide sufficient electric performance even when applied to the self-bias circuit having a simple construction has long been desired.

In forming the microwave circuit apparatuses in general such as the microwave amplifier, a GaAs field effect transistor (hereinafter referred to as the "FET") having excellent high frequency characteristics has been disposed on a dielectric substrate such as a ceramic substrate together with other circuit elements.

Typical examples of the conventional microwave circuit apparatus of this kind are illustrated in FIGS. 1 through 4. FIG. 1 shows a conventional microwave circuit apparatus in which self-bias is applied to the FET. Reference numerals 1, 2, 3 and 4 represent microstrip lines for impedance matching or for transmission, and reference numerals 6 and 7 represent an impedance matching capacitor or a d.c. blocking capacitor. Reference numeral 8 represents a bypass capacitor for connecting the source S of the FET 5 to the microstrip line 12 by high frequencies on the grounding side and reference numeral 9 represents a bias resistor which generates a bias voltage necessary for the operation of the FET 5. Reference numeral 10 represents a gate resistor for applying the bias voltage to the gate G of the FET 5 and reference numeral 11 represents a drain resistor for applying the power source voltage $B_1$ to the drain D of the FET 5. Reference numeral 12 represents a microstrip line which functions as a high frequency ground and also as the ground with respect to the power source $B_1$. All these circuit elements are formed on a dielectric substrate by printing or like means as shown in FIGS. 2A and 2B. Reference numeral 5 represents the FET as the functional element and symbols IN and OUT represent the input and output terminals of the microwave circuit apparatus, respectively.

In the conventional microwave circuit apparatus shown in FIG. 1, high frequencies at the source S of the FET 5 are grounded to the microstrip line 12 by the capacitor 8 and its route extends from the electrode 8B forming the capacitor 8→electrode 8A→dielectric 8C→electrode 8D→through-hole 26→microstrip line 12. Hence, the distance from the source S to the microstrip line 12 is large and the high frequency loss by the electrodes 8B, 8A and 8D increases. Furthermore, since the capacitor 8 is disposed on the surface of the dielectric substrate 27 together with the FET 5 and the other circuit elements, its occupying space is limited and the dielectric loss of the dielectric 8C also increases. In other words, an inductance 8' and a resistor 8" exist in the grounding route of the source S of the FET 5, as illustrated in the equivalent circuit diagram of FIG. 3. As a result, a part of the output of the FET is fed back to the input through the source S so that when the microwave circuit apparatus is a microwave amplifier, sufficient gain can not be obtained. Moreover, operational stability as the amplifier drops and high frequency parasitic oscillation is likely to occur.

FIG. 4 shows a fixed bias circuit which has gained a wide application in microwave circuit apparatuses as a circuit that eliminates the problems described above. Like reference numerals are used in FIG. 4 to identify like constituents as in FIG. 1. The circuit portion 14 encircled by dotted line in FIG. 4 is one that obtains a negative bias voltage $B_2$ necessary for the gate G of the FET 5 from a single positive power source $B_1$. The circuit portion 14 consists of an astable multivibrator 16 and a rectification-smoothing circuit 17. The circuit portion 13 encircled by another dotted line is one that stabilizes the bias of the FET 5. A voltage necessary for the gate G and drain D of the FET is fed thereto through this circuit portion 13. The source S of the FET 5 is directly connected to the microstrip line 12 on the grounding side, thus forming the microwave circuit apparatus. The circuit shown in FIG. 4 is also disposed on the dielectric substrate in the same way as the circuit shown in FIG. 1.

Microwave circuit apparatuses for satellite communication are used outdoors as the outdoor units and in order to simplify the feed of power, only a single, positive power source is generally applied to the outdoor unit while a negative power source is generated inside the unit. This system is shown in FIG. 4.

The embodiment shown in FIG. 4 has an excellent high frequency grounding effect of the source S but the circuit portions 13 and 14 make the apparatus as a whole further complicated. Accordingly, the microwave circuit apparatus can not be made compact, the number of components increases and various problems occur such as drop of reliability, lowering of the assembly working factor, increase in the cost of components and in the power consumption that in turn results in the increase in the maintenance cost, and so forth.

SUMMARY OF THE INVENTION

The present invention is therefore directed to provide a microwave circuit apparatus which eliminates a large number of problems with the prior art apparatuses and has an excellent grounding effect of an electrode of a functional element which is to have its high frequencies grounded when the same self-bias circuit is constructed by d.c. as in the prior art apparatuses. The other objects, features and advantages of the present invention will become more apparent from the following description to be taken in conjunction with the accompanying drawings.

DESCRIPTION OF THE PREFERRED EMBODIMENTS

Hereinafter, preferred embodiments of the present invention will be described with reference to the accompanying drawings, taking the microwave amplifier as an example.

Figure 1:
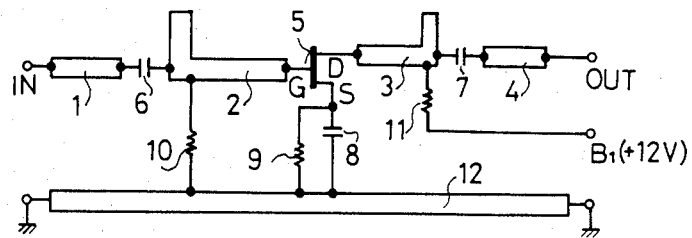
FIG. 1 is a circuit diagram of the conventional microwave circuit apparatus.
Figure 2A:
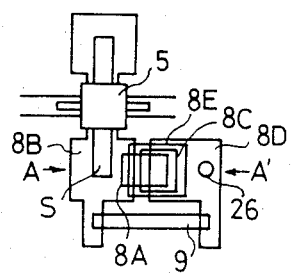
FIG. 2A is a pattern diagram of the principal portions of the surface of a dielectric substrate when the circuit of FIG. 1 is formed on the substrate.
Figure 2B:
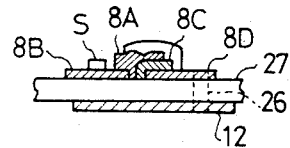
FIG. 2B is a sectional view taken along line A—A' of FIG. 2A.
Figure 3:
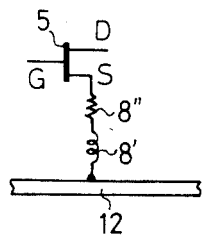
FIG. 3 is a high frequency equivalent circuit diagram between the source electrode S and the microstrip line 12 in FIG. 1.
Figure 4:
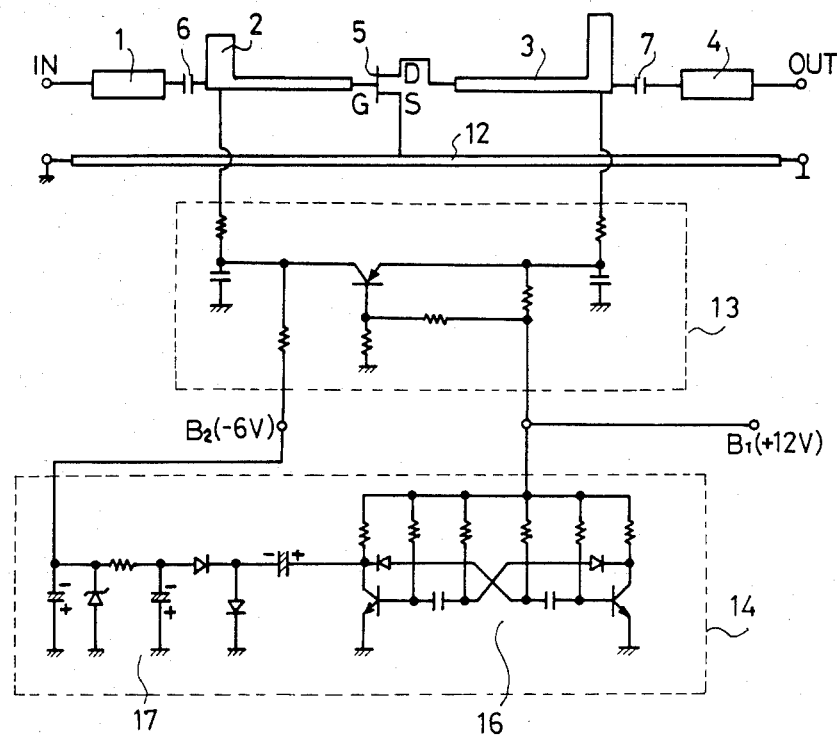
FIG. 4 is a circuit diagram of another microwave circuit apparatus in accordance with the prior art.
Figure 5:
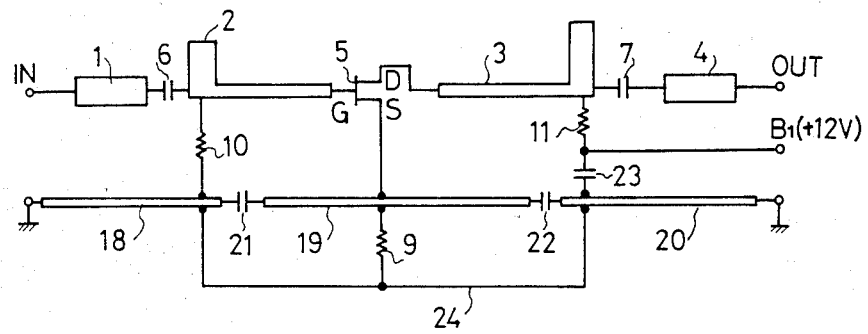
FIG. 5 is a circuit diagram of one embodiment of the present invention.

FIG. 5 shows the circuit of the microwave amplifier when it is formed on the dielectric substrate in accordance with the present invention. In this drawing, like reference numerals represent like constituents as in FIG. 1. Reference numerals 1 through 4 represent microstrip lines for impedance matching or for transmission line and reference numerals 6 and 7 represent capacitors for impedance matching or for d.c. blocking. They are analogous to those shown in FIGS. 1 through 4. Reference numerals 18, 19 and 20 represent high frequency grounding microstrip lines. Their shapes are determined so that the amplifier operates with predetermined characteristics. These microstrip lines are disposed on the dielectric substrate by printing or the like. Among them, the microstrip lines 18 and 20 are grounded for d.c. while the microstrip line 19 is directly connected to the source S of the FET 5 and indirectly to the microstrip lines 18 and 20 via the d.c. blocking capacitors 21 and 22, respectively. Reference numerals 9 and 10 represent bias resistors for applying bias to the gate G of the FET 5 in the same way as in FIG. 1 and reference numeral 11 represents the resistor for applying the power source $B_1$ to the drain D of the FET 5. Reference numeral 23 represents the bypass capacitor of the power source $B_1$.

Figure 6:
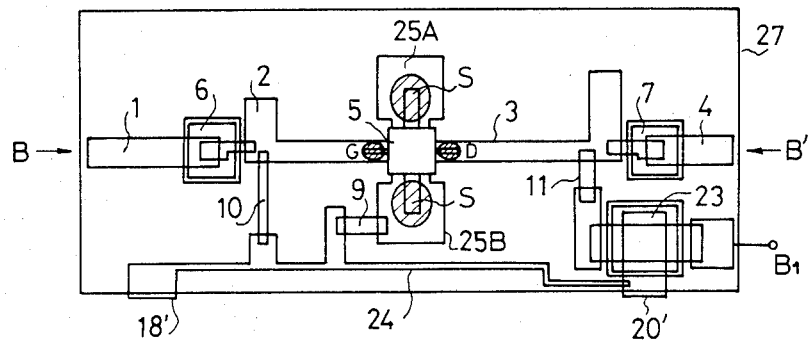
FIG. 6 is a pattern diagram when the circuit of FIG. 5 is formed on the dielectric substrate.
Figure 7:
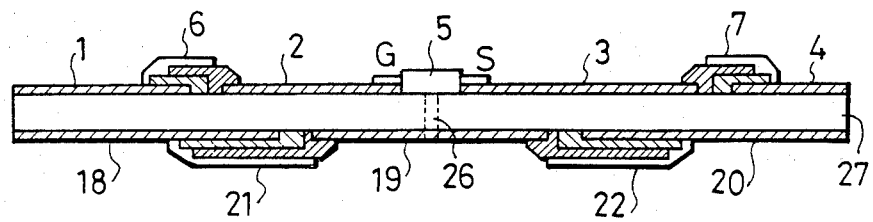
FIG. 7 is a sectional view taken along line B—B' of FIG. 7.
Figure 8:
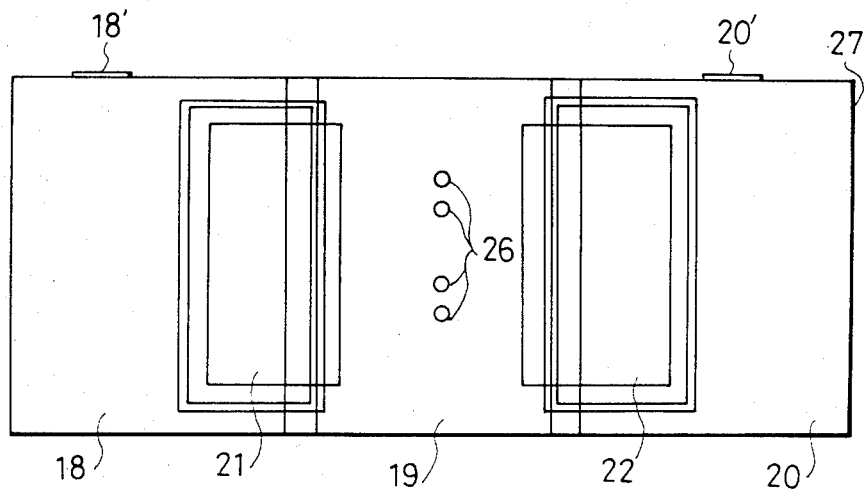
FIG. 8 is a reverse pattern diagram corresponding to FIG. 6.

FIG. 6 is a pattern diagram on the substrate surface when the circuit of FIG. 5 is formed on the dielectric substrate such as a ceramic substrate. FIG. 7 is a sectional view taken along line B—B' of FIG. 6 and FIG. 8 is a reverse pattern diagram corresponding to FIG. 6. In these drawings, reference numeral 27 represents the dielectric substrate forming the microwave circuit apparatus and reference numerals 25A and 25B represent the electrodes for connecting the source S of the FET 5. These electrodes are connected to the microstrip line 19 disposed on the reverse of the substrate 27 by a plurality of through-holes 26 that are bored so as to penetrate through both sides of the substrate 27. Besides the microstrip line 19 connected to the through-hole 26, the microstrip lines 18 and 20 are also disposed on the reverse of the dielectric substrate 27 and are connected to the microstrip line 19 by the capacitors 21 and 22, respectively. The connecting line 24 is connected to the microstrip lines 18 and 20 that are disposed on the reverse of the dielectric substrate 27 at both end portions 18' and 20' shown in FIGS. 6 and 8 by use of the edge surface of the substrate.

In the embodiment of the invention described above, the source S of the FET 5 is grounded for d.c. by the bias resistor 9 and its gate G is also grounded by the gate resistor 10. Hence, the gate G is kept at a negative potential with respect to the source S by a potential corresponding to the voltage drop across the bias resistor 9 and can thus provide a bias voltage necessary for the operation of the N channel GaAs FET. Hence, the circuit functions in the same way as in the ordinary self-bias circuits. From the viewpoint of high frequency, however, since the source S of the FET 5 is directly connected to the microstrip line 19 via the through-hole 26 alone, the distance between the source S and the microstrip line 19 can be minimized and hence, the high frequency loss can also be minimized. Since the capacitors 21 and 22 are disposed on the reverse of the dielectric substrate 27, their space can be increased so that the dielectric loss can be reduced. As a result, the existence of the resistor 8" and inductance 8' shown in FIG. 3 becomes negligible and the drop of gain and stability due to the feedback can be eliminated. Furthermore, since this embodiment is constructed by the self-bias circuit, the particular power source circuits 13 and 14 need not be disposed.

Figure 9:
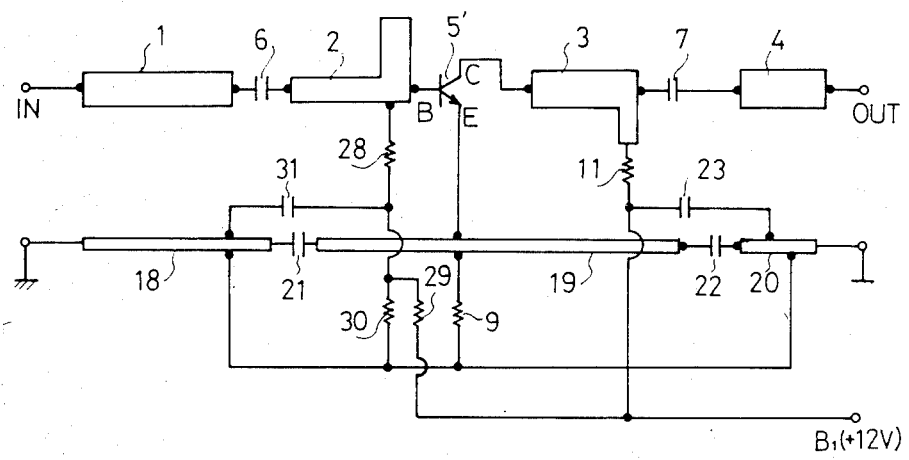
FIG. 9 is a circuit diagram of another embodiment of the present invention.

FIG. 9 shows another embodiment of the present invention and is a circuit diagram of a microwave circuit apparatus up to about 4 GHz band by use of a bipolar transistor 5'. The bias in this drawing is given by a resistor 9 interposed between the emitter E of the transistor 5' and the ground and resistors 29 and 30 interposed between the power source $B_1$ and the ground. These circuit elements are disposed on the surface of the dielectric substrate 27 in the same way as in FIGS. 6 through 8. On the other hand, the microstrip lines 18, 19 and 20 can be disposed on the reverse of the dielectric substrate 27 together with the capacitors 21 and 22. A resistor 28 provides the bias to the base B. Reference numeral 31 represents a bypass capacitor. The other circuit elements are the same as those used in the embodiment shown in FIG. 5. This embodiment provides the same effect as the embodiment shown in FIG. 5.

As described above, in accordance with the present invention, the first microstrip line 19 directly connected to the source S of the FET 5 to be grounded high frequency-wise and the second microstrip lines 18 and 20 that are connected to the first microstrip line 19 via the capacitors 21 and 22 and are grounded d.c.-wise are disposed in such a manner that the second microstrip lines 18 and 20 are grounded d.c.-wise with respect to the power source $B_1$ and are grounded also with respect to the signal. Accordingly, the present invention can construct the microwave circuit apparatus which has excellent high frequency characteristics and is especially suitable for the self-bias circuit in a reduced size and with improved reliability. From the aspect of production, the cost of components and the assembly cost can be reduced and from the aspect of the circuit operation, the maintenance charge can be reduced as the power consumption is reduced.

In the foregoing embodiments, the FET 5 is disposed on the surface of the dielectric substrate 27 while the microstrip lines 18, 19 and 20 as well as the capacitors 21 and 22 are disposed on the reverse of the substrate. This arrangement reduces the distance between the source S of the FET 5 and the microstrip line 19 and reduces the high frequency loss. Moreover, the capacitor area can be increased to reduce the dielectric loss. Hence, the microwave circuit apparatus having further improved high frequency characteristics can be constructed.

What is claimed is:

1. A microwave circuit apparatus comprising:
   at least one first microstrip line;
   at least one second microstrip line;
   at least one capacitor interposed between said first microstrip line and said second microstrip line; and
   a functional element having a first electrode thereof connected high frequency-wise to said first microstrip line;
   said second microstrip line being grounded with respect to a power source, wherein said first microstrip line, said second microstrip line and at least one of said capacitors interposed between said first and second microstrip liens are disposed on the surface opposite the surface on which said functional element is disposed.

2. The microwave circuit apparatus as defined in claim 1 wherein said functional element is a GaAs field effect transistor.

3. The microwave circuit apparatus as defined in claim 1 wherein said first and second microstrip lines are formed on a dielectric substrate by printing.

* * * * *